United States Patent
Karami Porzani et al.

(10) Patent No.: US 10,782,115 B2
(45) Date of Patent: Sep. 22, 2020

(54) DETECTION OF RADIAL DEFORMATIONS OF TRANSFORMERS

(71) Applicants: Hossein Karami Porzani, Tehran (IR); Gevork Babamalek Gharehpetian, Tehran (IR); Maryam Alsadat Akhavan Hejazi, Kashan (IR); Yaser Norouzi, Tehran (IR)

(72) Inventors: Hossein Karami Porzani, Tehran (IR); Gevork Babamalek Gharehpetian, Tehran (IR); Maryam Alsadat Akhavan Hejazi, Kashan (IR); Yaser Norouzi, Tehran (IR)

(*) Notice: Subject to any disclaimer, the term of this patent is extended or adjusted under 35 U.S.C. 154(b) by 309 days.

(21) Appl. No.: 15/688,845

(22) Filed: Aug. 28, 2017

(65) Prior Publication Data

US 2017/0356733 A1 Dec. 14, 2017

Related U.S. Application Data

(60) Provisional application No. 62/382,789, filed on Sep. 2, 2016.

(51) Int. Cl.
*G01B 7/16* (2006.01)
*G01S 13/90* (2006.01)
(Continued)

(52) U.S. Cl.
CPC ............... *G01B 7/16* (2013.01); *G01R 31/62* (2020.01); *G01R 31/72* (2020.01);
(Continued)

(58) Field of Classification Search
CPC ................................. G01B 7/16; G01R 31/027
See application file for complete search history.

(56) References Cited

U.S. PATENT DOCUMENTS

| 6,445,334 B1 * | 9/2002 | Bradley | G01S 7/20 342/195 |
| 6,570,394 B1 * | 5/2003 | Williams | H04B 3/46 324/620 |

(Continued)

FOREIGN PATENT DOCUMENTS

| CN | 101614775 B | 4/2011 |
| CN | 203551763 U | 4/2014 |

(Continued)

OTHER PUBLICATIONS

Mohammad Sadegh Golsorkhi, A feasibility study on the application of radar imaging for the detection of transformer winding radial deformation, IEEE Transactions on Power Delivery, 2012, vol. 27, Issue 4, pp. 2113-2121.

(Continued)

Primary Examiner — Marcus E Windrich
(74) Attorney, Agent, or Firm — Bajwa IP Law Firm; Haris Zaheer Bajwa

(57) ABSTRACT

A method for detecting radial deformation in a winding of a transformer may include synthetic aperture radar (SAR) imaging of the winding using ultra high frequency (UHF) electromagnetic signals in a first instance of the winding to obtain a first image of the winding; SAR imaging of the winding using UHF electromagnetic signals in a second instance of the winding to obtain a second image of the winding; and comparing the first image of the winding and the second image of the winding to detect a radial deformation in the winding. The UHF electromagnetic signals may be transmitted as a plurality of successive sinusoidal signals, where frequencies of the successive sinusoidal signals gradually change from a first frequency to a second frequency.

7 Claims, 13 Drawing Sheets

(51) Int. Cl.
| | |
|---|---|
| *G01S 13/76* | (2006.01) |
| *G01S 13/02* | (2006.01) |
| *G01R 31/62* | (2020.01) |
| *G01R 31/72* | (2020.01) |
| *G01S 13/88* | (2006.01) |

(52) U.S. Cl.
CPC ........ *G01S 13/0209* (2013.01); *G01S 13/765* (2013.01); *G01S 13/90* (2013.01); *G01S 13/9005* (2013.01); *G01S 13/881* (2013.01)

(56) References Cited

U.S. PATENT DOCUMENTS

| | | | |
|---|---|---|---|
| 8,008,926 | B2 | 8/2011 | Park et al. |
| 2002/0177232 | A1* | 11/2002 | Melker ................ G01N 29/069 436/151 |
| 2010/0303340 | A1* | 12/2010 | Abraham ................ G06T 7/285 382/154 |
| 2012/0130663 | A1* | 5/2012 | Madhukar .............. G01R 31/62 702/65 |

FOREIGN PATENT DOCUMENTS

| | | |
|---|---|---|
| CN | 204116541 U | 1/2015 |
| CN | 105403814 A | 3/2016 |

OTHER PUBLICATIONS

Maryam Sadat Akhavan Hejazi, Application of ultra-wideband sensors for on-line monitoring of transformer winding radial deformations—A feasibility study, IEEE Sensors Journal, 2012, vol. 12, Issue 6, pp. 1649-1659.

Shahed Mortazavian, Experimental studies on monitoring and metering of radial deformations on transformer HV winding using image processing and UWB transceivers, IEEE Transactions on Industrial Informatics, 2015, vol. 11, Issue 6, pp. 1334-1345.

Raziyeh Mosayebi, Detection of winding radial deformation in power transformers by confocal microwave imaging, Electric Power Components and Systems, 2014, vol. 42, Issue 6, pp. 605-611.

Martin D. Judd, Partial discharge monitoring of power transformers using UHF sensors. Part I: sensors and signal interpretation, IEEE Electrical Insulation Magazine, 2005, vol. 21, Issue 2, pp. 5-14.

Jingcun Liu, Study on miniaturized UHF antennas for partial discharge detection in high-voltage electrical equipment, Sensors, 2015, vol. 15, Issue 11, pp. 29434-29451.

S. Mortazavian, A simultaneous method for detection of radial deformation and axial displacement in transformer winding using UWB SAR imaging, Thermal Power Plants (CTPP), 2012 4th Conference on. IEEE, 2012.

Hossein Karami, GLRT-based mitigation of partial discharge effect on detection of radial deformation of transformer HV winding using SAR imaging method, IEEE Sensors Journal, 2016, vol. 16, Issue 19, pp. 7234-7241.

* cited by examiner

DETECTION OF RADIAL DEFORMATIONS OF TRANSFORMERS

CROSS-REFERENCE TO RELATED APPLICATION

This application claims the benefit of priority from U.S. Provisional Patent Application Ser. No. 62/382,789, filed on Sep. 2, 2016, and entitled "DETECTION OF RADIAL DEFORMATION OF TRANSFORMERS BY USING UHF STEPPED FREQUENCY BASED SAR IMAGING METHOD," which is incorporated herein by reference in its entirety.

TECHNICAL FIELD

The present disclosure generally relates to online condition monitoring of transformers, and particularly to methods and devices for online detection of radial deformations of transformers.

BACKGROUND

Online monitoring of power system equipment, such as power transformers, plays an important role in improving reliability and efficiency of power systems. A transformer may be associated with different mechanical faults, which may be caused by mechanical forces that arise due to short circuits, explosions, and earthquakes, etc. For example, radial deformations may occur in a transformer winding due to forces that are incurred in a radial direction. The radial deformations may include one or more protuberances or fovea in the transformer winding.

Online detection of such mechanical defects protects a transformer from incurring serious damage and it allows for the transformer to be utilized for a longer service period. The mechanical faults in a transformer, along with aging, can over time impact winding insulation functionality, which in turn may cause short circuits and severe damage to the winding. In case of detection of a faulty transformer, the transformer may be taken out of service and it may be repaired urgently. This increases reliability of the power system.

Various methods have been disclosed in the art for monitoring transformer status, such as a transformer function method, low-voltage impulse test, ultra wideband sensor method, short circuit impedance method, and S-parameter-based method. However, these methods have various limitations such as not being able to provide a comprehensive online insight of the mechanical fault, for example, type, magnitude, and position of the mechanical fault.

There is, therefore a need in the art for a simple method and device for in-depth online detection of mechanical faults such as radial deformations in transformer windings. There is further a need in the art for a simple method and device capable of providing details of the faults without any interferences or misleading disturbances.

SUMMARY

This summary is intended to provide an overview of the subject matter of the present disclosure, and is not intended to identify essential elements or key elements of the subject matter, nor is it intended to be used to determine the scope of the claimed embodiments. The proper scope of the present disclosure may be ascertained from the claims set forth below in view of the detailed description below and the drawings.

In an exemplary embodiment consistent with the present disclosure, a method for detecting radial deformation in a winding of a transformer is disclosed. The method may include synthetic aperture radar (SAR) imaging of the winding using ultra high frequency (UHF) electromagnetic signals in a first instance of the winding to obtain a first image of the winding; SAR imaging of the winding using UHF electromagnetic signals in a second instance of the winding to obtain a second image of the winding; and comparing the first image of the winding and the second image of the winding to detect a radial deformation in the winding. The UHF electromagnetic signals may be transmitted as a plurality of successive sinusoidal signals, where frequencies of the successive sinusoidal signals gradually change from a first frequency to a second frequency.

In an exemplary embodiment, the SAR imaging may include: transmitting UHF electromagnetic signals by a first transceiver antenna and receiving reflected UHF electromagnetic signals from the winding by a second transceiver antenna. Transmitting of UHF electromagnetic signals and receiving of reflected UHF electromagnetic signals may be carried out in a series of scanning steps in which the first transceiver antenna and the second transceiver antenna may be gradually moved along a longitudinal axis of the winding from one scanning step to the next. The SAR imaging may further include calculating an amount of energy reflected from each point of the winding based on the received reflected UHF electromagnetic signals for each of the scanning steps.

According to an exemplary embodiment, comparing the first image and the second image may involve comparing the amount of energy reflected from each point of the winding in the first instance with the amount of energy reflected from each point of the winding in the second instance. According to an exemplary embodiment, calculating the amount of energy reflected from each point of the winding may be carried out utilizing Kirchhoff migration method.

According to an exemplary embodiment, the plurality of successive sinusoidal signals may be transmitted in a series of successive frequency steps, where in each frequency step, a sinusoidal signal may be transmitted and the frequency of each transmitted sinusoidal signal changes from one frequency step to the next with a predetermined frequency step.

According to an exemplary embodiment, in order to obtain a time domain UHF electromagnetic signal for each scanning step, an inverse fast Fourier transform (IFFT) may be performed on magnitudes and phases of the received reflections of the plurality of successive sinusoidal signals for all frequency steps in each scanning step.

In an exemplary embodiment, the method for detecting radial deformation in a winding of a transformer may further include comparing frequency of each transmitted sinusoidal signal in each frequency step with a frequency of a received reflection of the transmitted sinusoidal signal in that frequency step.

In an exemplary embodiment, the method for detecting radial deformation in a winding of a transformer may further include identifying a frequency step for which frequency of a transmitted sinusoidal signal differs from a frequency of a received reflection of the transmitted sinusoidal signal as a partial discharge-corrupted frequency step.

According to an exemplary embodiment, identifying a partial discharge-corrupted frequency step is carried out by a generalized likelihood ratio test and transmission of the sinusoidal signal for a partial discharge-corrupted frequency step may be repeated.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Synthetic aperture radar (SAR) imaging of power transformer windings using ultra-wideband (UWB) signals (i.e., UWB SAR imaging) may be used for detection of radial deformations in the transformer windings. In the exemplary UWB SAR imaging method, a Gaussian pulse that is modulated by a sinusoidal carrier may be transmitted by a transmitting antenna into an environment containing the transformer winding, and a reflected signal from the transformer winding may be received by a receiving antenna.

Figure 1A:
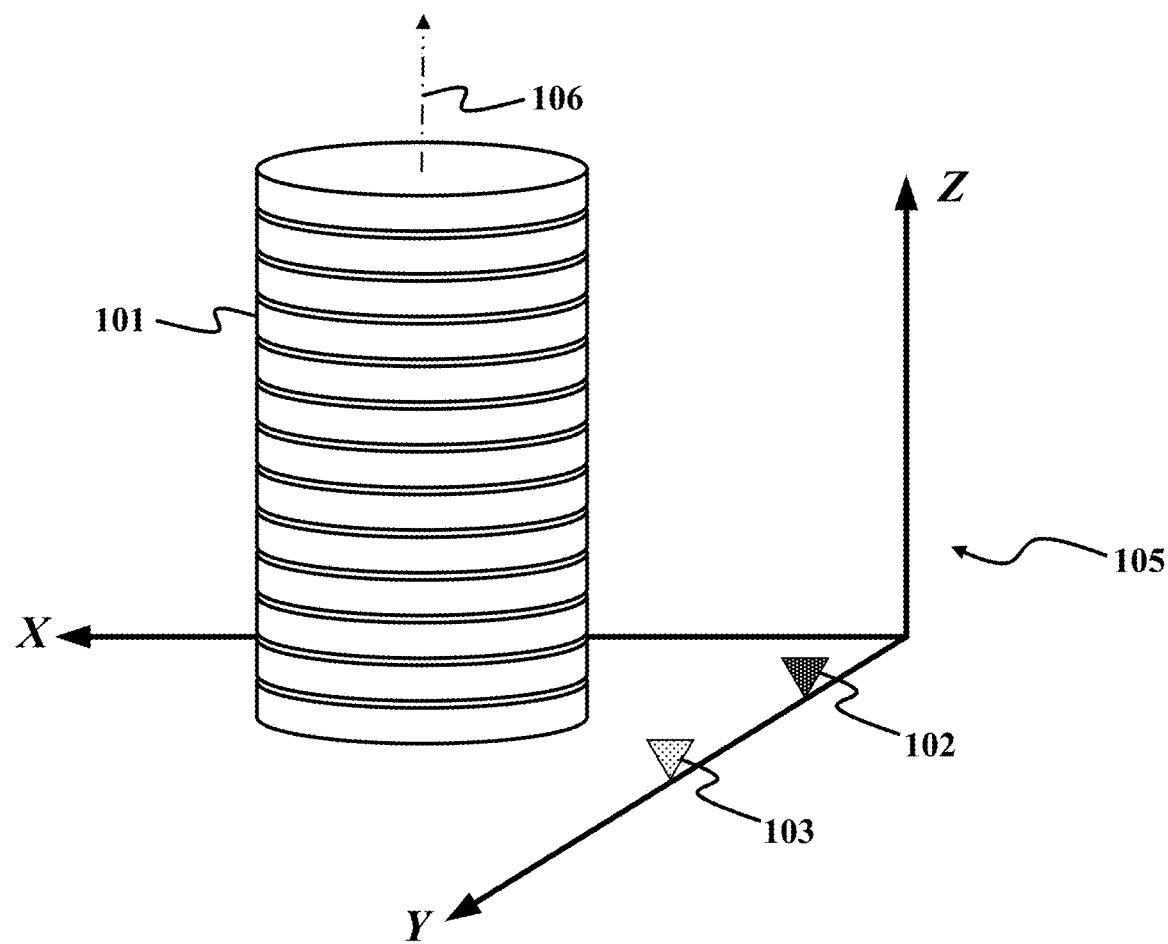
FIG. 1A is a schematic representation of a synthetic aperture radar (SAR) imaging setup for detection of radial deformation in a transformer winding, consistent with one or more exemplary embodiments of the present disclosure.
Figure 1B:
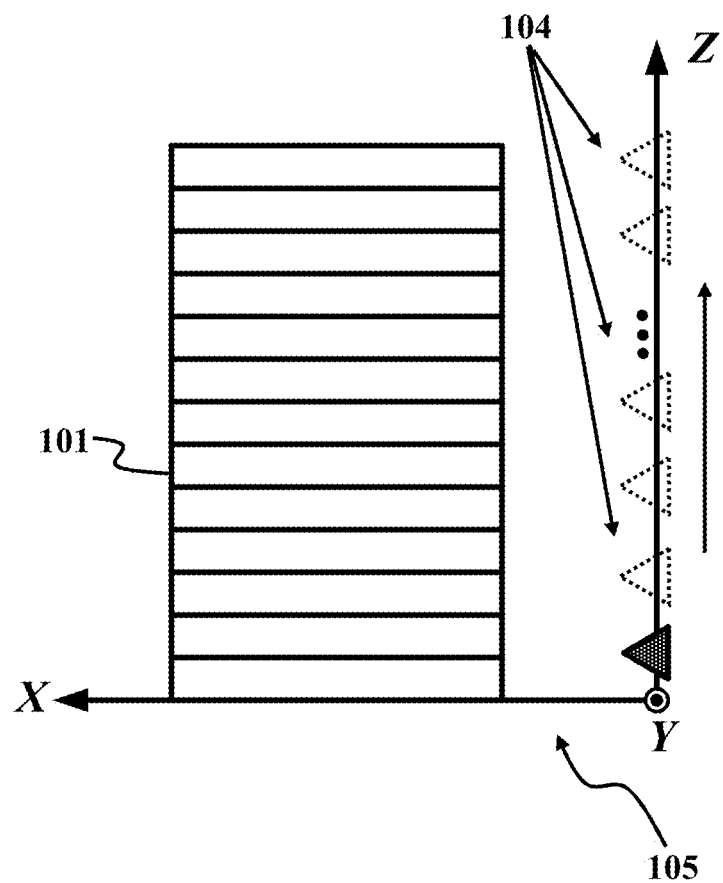
FIG. 1B is a schematic representation of a side-view of a SAR imaging setup for detection of radial deformation in a transformer winding, consistent with one or more exemplary embodiments of the present disclosure.

FIG. 1A is a schematic representation of a SAR imaging setup for detection of radial deformation in a transformer winding 101 and FIG. 1B is a side-view of the same SAR imaging setup. Referring to FIG. 1A, a first transceiver antenna 102 and a second transceiver antenna 103 may be placed at a specific distance from transformer winding 101. For example, transceiver antennas 102, 103 may be installed on transformer tank (not illustrated in FIG. 1A). First transceiver antenna 102 may transmit a signal and second transceiver antenna 103 may receive a reflected signal from the surface of the transformer winding 101. The reflected signal received by second transceiver antenna 103 may provide one-dimensional (1D) information about the transformer winding 101. Referring to FIGS. 1A and 1B, in order to create a two-dimensional (2D) image of the transformer winding 101, first and second transceiver antennas 102, 103 may be moved in a stepwise manner along longitudinal axis 106 of the transformer winding with predetermined step sizes and at each step, the steps of sending a signal and receiving a reflected signal may be repeated to obtain 1D information for each step. Each step of sending a signal receiving a reflected signal may be referred to as a scanning step 104 and each scanning steps 104 may occur at and equal distance from one another. Once 1D information of the transformer winding is gathered for all scanning steps 104 along the height of the transformer winding 101, then a 2D image of the transformer winding 101 may be generated. Number of scanning steps 104 along the height of the transformer winding 101 determines the resolution of the 2D image of the transformer winding 101.

According to an exemplary embodiment, Kirchhoff migration method may be performed on the received signals in all scanning steps 104 to form a 2D image of the transformer winding 101. Referring to FIGS. 1A and 1B, a Cartesian coordinate system 105 may be defined with three mutually perpendicular axes X, Y, and Z. X and Y axes may be defined on a plane perpendicular to longitudinal axis 106 of transformer winding 101 and Z axis may be defined parallel to longitudinal axis 106 of the transformer winding 101. The 2D image of the transformer winding 101 may be generated by calculating magnitude of the reflected signal for every point on transformer winding 101 on planes parallel to X-Y plane for all scanning steps 104.

Final formulation of the Kirchhoff migration method for plotting the 2D image is as Equation (1) below:

$$U(id_0, jd_0) = U(id_0, jd_0) + \frac{d_M \cdot jd_0}{2\pi \cdot R^2 \cdot v \cdot T_s} \times \qquad \text{Equation (1)}$$

$$\sum_k [f(kd_M, (n+1)T_s) - f(kd_M, nT_s)]|_{nT_s = 2R/v}$$

$$i, j, k \in Z \text{ and } 0 \leq i < M, 0 \leq j < G, 0 \leq k < K$$

For purposes of the present disclosure, in Equation (1), U denotes 2D image function, which determines the amount of energy reflected from each point of the surface of the transformer winding. A matrix of image function values may be obtained, where each element of the matrix represents the amount of energy reflected from a corresponding point on the surface of the transformer winding.

Figure 1C:
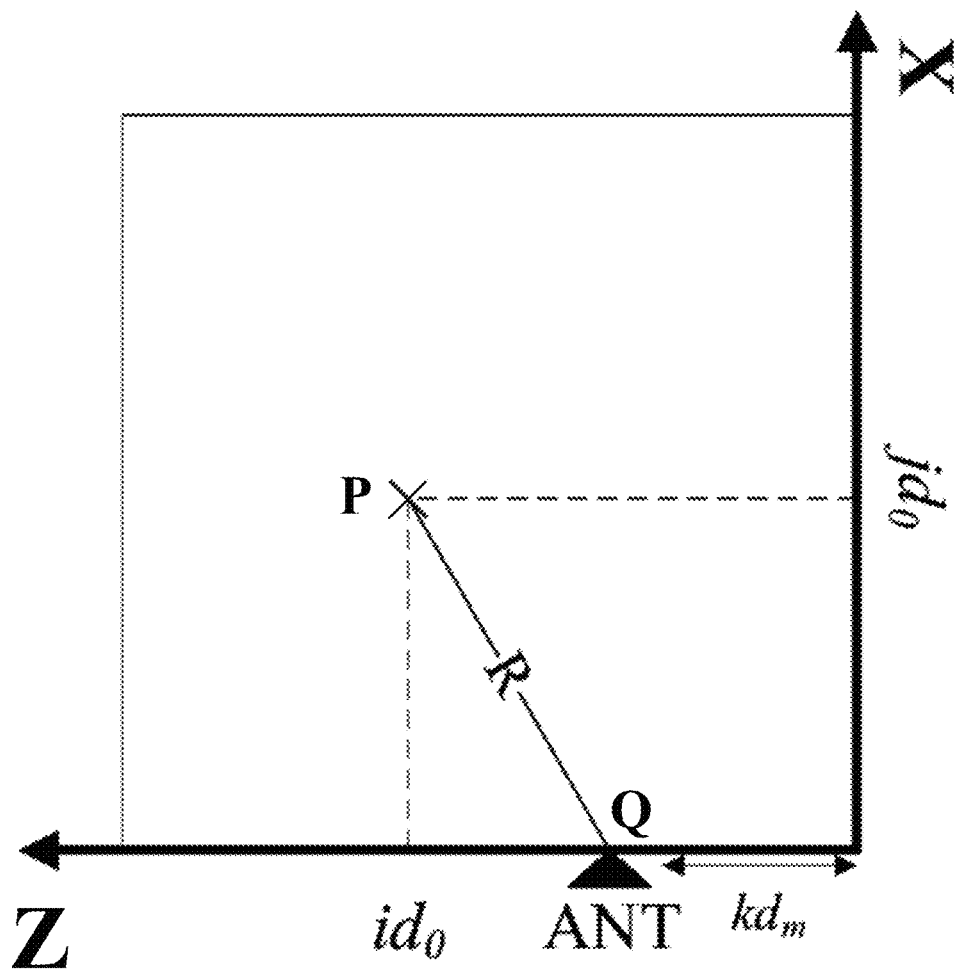
FIG. 1C depicts an implementation of the Kirchhoff migration formula based on a discrete boundary condition function.

FIG. 1C depicts an implementation of the Kirchhoff migration formula based on a discrete boundary condition function. Transceiver antenna is located at point Q ($kd_M$, 0) and an arbitrary point of the surface of the transformer winding is for example located at P ($id_0$, $jd_0$). Magnitude of image function at arbitrary point, P ($id_0$, $jd_0$), may be obtained by equation (1). $T_s$ denotes scanning sample time, $d_M$ denotes distance between two adjacent scanning steps, $kd_M$ is coordinate of k-th scanning step on Z axis, $d_0$ denotes spatial point, M denotes number of image pixels on Z-axis, G denotes number of image pixels on X-axis, k is total number of scanned points, f denotes value of the field boundary, and c denotes wave speed.

In an exemplary embodiment, a 2D image of the transformer winding may be obtained by plotting an image function, U in a color-map scale. In the color-map scale plots, the color of a point or pixel indicates the magnitude of the image function at that point. According to an embodiment, an image correlation method may be utilized to detect radial deformations in the transformer winding. In the image correlation method, 2D images of the transformer winding at a given time during service life of the winding is compared to a 2D image of the winding before installation of the transformer, which will be described in detail later in the present disclosure. Color-map scale plots may serve as visual aids in the image correlation method.

According to an exemplary embodiment, in order to detect radial deformations in the transformer winding, values of the image function at a given time during service life of the winding may be compared to values of the image function before installation of the transformer, where any difference between the two values may be an indicator of a radial deformation.

It should be noted, transformer tanks are made of conductive materials, and electromagnetic waves cannot penetrate through the conductive materials. Therefore, according to an exemplary embodiment, in order to perform SAR imaging, a window may be installed on the transformer tank, for example, by cutting some part of the transformer tank and covering it by an insulator window. Then, the transceiver antennas may be placed in front of the insulator window. The electromagnetic waves may easily pass through the insulator, reaching the transformer winding, and reflecting back to the transceiver antennas.

Exemplary systems and methods disclosed herein may be directed to detection of radial deformations in power transformer windings by SAR imaging of power transformer windings using UHF electromagnetic signals (i.e., UHF SAR imaging) instead of UWB signals.

UHF SAR imaging may be used for detection of partial discharge in the transformer windings. Detection of both partial discharge and radial deformations may be carried out with two sets of antennas, where a first set of antennas may be utilized for UHF SAR imaging of power transformer windings in order to detect partial discharge, and a second set of antennas may be utilized for UWB SAR imaging of power transformer windings in order to detect radial deformations. Alternatively, a large antenna may be utilized for transmitting both UHF and UWB signals, which may be associated with limitations in online detection of partial discharge and radial deformations. Detection of both partial discharge and radial deformations, simultaneously, may be possible with only one set of antennas using UHF SAR imaging of power transformer windings. However, simultaneous detection of both partial discharge and radial deformations with only one set of antennas using UHF SAR imaging of power transformer windings may be lead to generation of inaccurate or incorrect two-dimensional images of transformer windings due to possible partial discharge occurrence. In other words, partial discharge occurrence during UHF SAR imaging may cause distortion in two-dimensional image of transformer windings.

According to exemplary embodiments of the present disclosure, in order to avoid partial discharge interference in generating two dimensional images of transformer windings by UHF SAR imaging, a UHF stepped-frequency method may be utilized for detection of radial deformations, and a generalized likelihood ratio test (GLRT) may be adapted and applied to detect partial discharge occurrence during UHF SAR imaging.

Figure 2A:
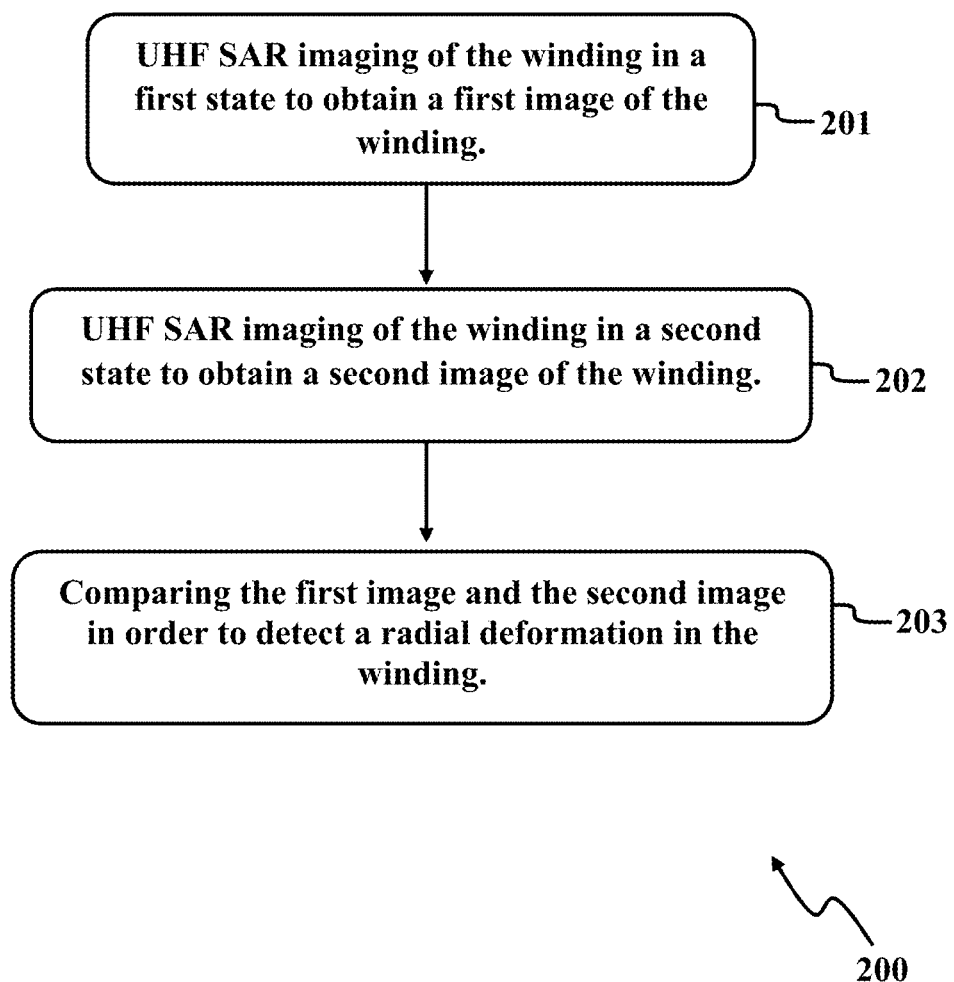
FIG. 2A illustrates a method for detecting radial deformation in a transformer winding, consistent with one or more exemplary embodiments of the present disclosure.

FIG. 2A illustrates a method 200 for detecting radial deformation in a transformer winding, according to one or more exemplary embodiments of the present disclosure. In an exemplary embodiment, method 200 may include a first step 201 of UHF SAR imaging of the winding in a first instance to obtain a first image of the winding; a second step 202 of UHF SAR imaging of the winding in a second instance to obtain a second image of the winding; and a third step 203 of comparing the first image and the second image in order to detect a radial deformation in the winding. For purposes of this disclosure, the first instance may refer to a state where there are no radial deformations in the winding (i.e. intact winding state) or before the initial use of the windings and the second instance may refer to a state of the winding at any given time during service life of the transformer. For example, the second image may be obtained every day or every week. Alternatively, the first and state may refer to different periods of time, a first period of time when an image is captured and a second period of time when an image is captured.

Figure 2B:
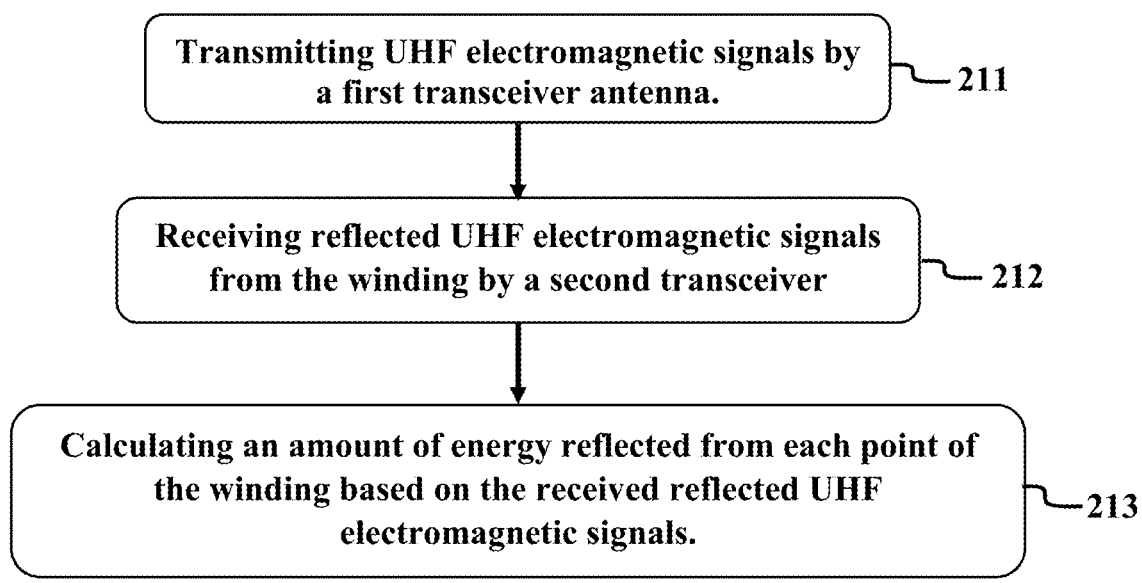
FIG. 2B illustrates a method for ultra-high frequency synthetic aperture radar (UHF SAR) imaging process, consistent with one or more exemplary embodiments of the present disclosure.

Referring to FIG. 2A, the first step 201 and second step 202 of the method 200 may involve UHF SAR imaging of the transformer winding in a signal range of 0.3 to 3 GHz. An embodiment of a UHF SAR imaging process that may be performed in the first step 201 and the second step 202 of method 200 is illustrated in FIG. 2B. Referring to FIG. 2B, a UHF SAR imaging process 210 may include a step 211 of transmitting UHF electromagnetic signals by a first transceiver antenna; a step 212 of receiving reflected UHF electromagnetic signals from the winding by a second transceiver; and a step 213 of calculating an amount of energy reflected from each point of the surface of the winding based on the received reflected UHF electromagnetic signals. According to an exemplary embodiment, a stepped-frequency method may be utilized for transmitting UHF electromagnetic signals by the first transceiver antenna. In the stepped frequency method, a transceiver antenna may transmit a range of sinusoidal signals instead of a train of Gaussian pulses. These sinusoidal signals may be successive sinusoidal signals, where the frequency of the signals changes from one sinusoidal signal to the next.

Referring to FIG. 2B, the step 211 and the step 212 may be carried out in a series of scanning steps. With further reference to FIGS. 1A and 1B, during the stepped frequency method, at each scanning step 104, first transceiver antenna 102 may send the successive sinusoidal signals with frequencies sweeping from the lowest frequency ($f_L$) to the highest frequency ($f_H$) with a predetermined frequency increment step ($\Delta f$) and at each frequency, the reflected signal may be picked up by second transceiver antenna 103.

Figure 3:
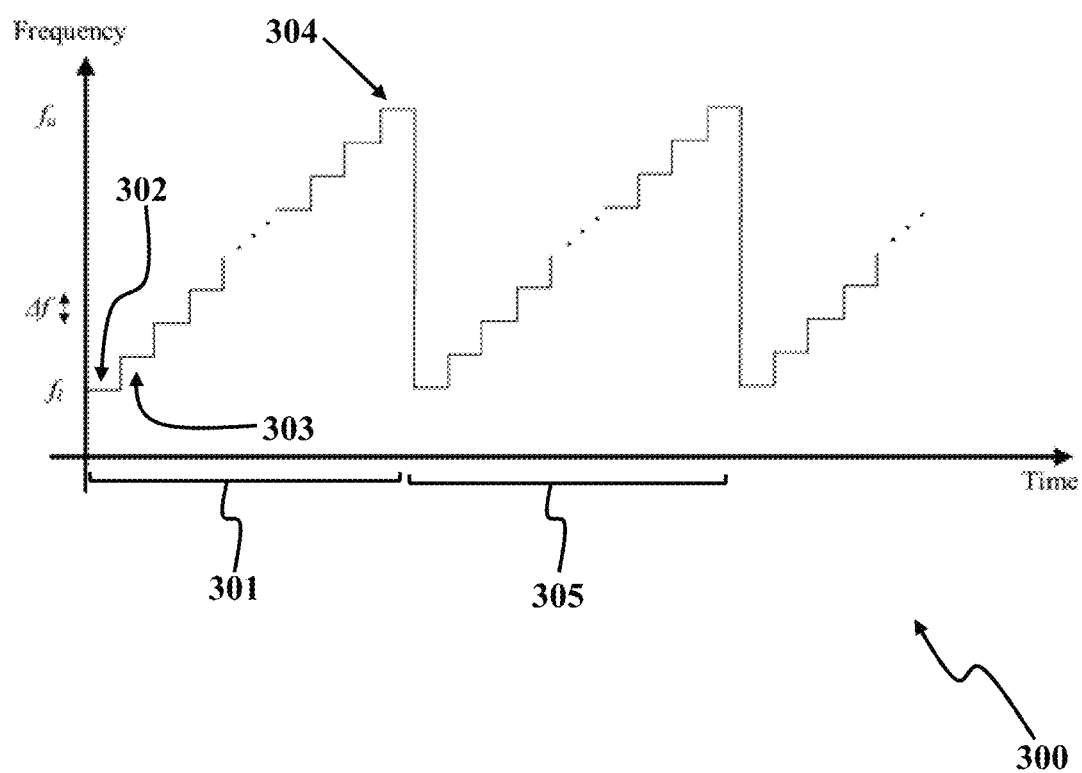
FIG. 3 is a frequency vs. time graph showing an implementation of stepped-frequency method, consistent with one or more exemplary embodiments of the present disclosure.

FIG. 3 is a frequency vs. time graph 300 showing an implementation of stepped-frequency method. Referring to FIGS. 1A, 1B, and 3, at a first scanning step 301 (similar to any of scanning steps 104), a sinusoidal pulse with a frequency 302 of $f_L$ is transmitted by transceiver antenna 102 and received by transceiver antenna 103. Then, a second sinusoidal pulse with a frequency 303 of $f_L+\Delta f$ is transmitted by transceiver antenna 102 and received by transceiver antenna 103. The frequency is increased in this manner step by step until the frequency of the transmitted sinusoidal pulse reaches a frequency 304 of $f_H$. Then, a time domain UHF electromagnetic signal for scanning step 301 may be obtained by performing an inverse fast Fourier transform (IFFT) on the magnitudes and phases of the gathered signals. After that, transceiver antennas 102 and 103 may be moved to a next scanning step 305 in order to obtain a time domain signal for scanning step 305. This procedure is repeated for all scanning steps 104.

Referring to FIG. 2B, the step 213 may include applying the Kirchhoff migration method on the received time domain UHF electromagnetic signals in order to calculate an amount of energy reflected from each point of the surface of the winding. According to an embodiment, the final formulation of the Kirchhoff migration method for calculating the amount of energy reflected from each point of the surface of the winding may be presented as Equation (1), which was described in detail in preceding sections of the present disclosure.

Utilizing the stepped-frequency method as described above may help eliminate distorting effects of partial discharge occurrence on detection of radial deformation. In a UHF SAR imaging method, occurrence of partial discharge may distort the 2D image of the transformer winding, and in case of a partial discharge occurrence, the SAR imaging process must be repeated. In contrast, in a UHF SAR imaging process performed by a stepped-frequency method, if a partial discharge occurs during transmitting and receiving sinusoidal pulses, it is not necessary to repeat the entire process of transmitting and receiving all the frequencies. The process should only be repeated for the frequency or frequencies, at which partial discharge has occurred. A new measurement for these frequencies can replace the previous measurements, in order to construct a partial discharge-free image of the transformer winding.

It is necessary to detect signals which contain a partial discharge signal. Emitted signal of a partial discharge has a wide range of frequencies in UHF band. If there is a difference between frequencies of transmitted and received signals in a frequency step of the stepped-frequency method, it may indicate that partial discharge has happened at that frequency step, which means transmitting and receiving of signals must be repeated for that frequency. In other words, in instances when transmitted and received signals only differ in magnitude and phase, no partial discharge has occurred. However, in instances, when transmitted and received signals differ in magnitude, phase, and frequency, partial discharge has occurred.

Figure 2C:
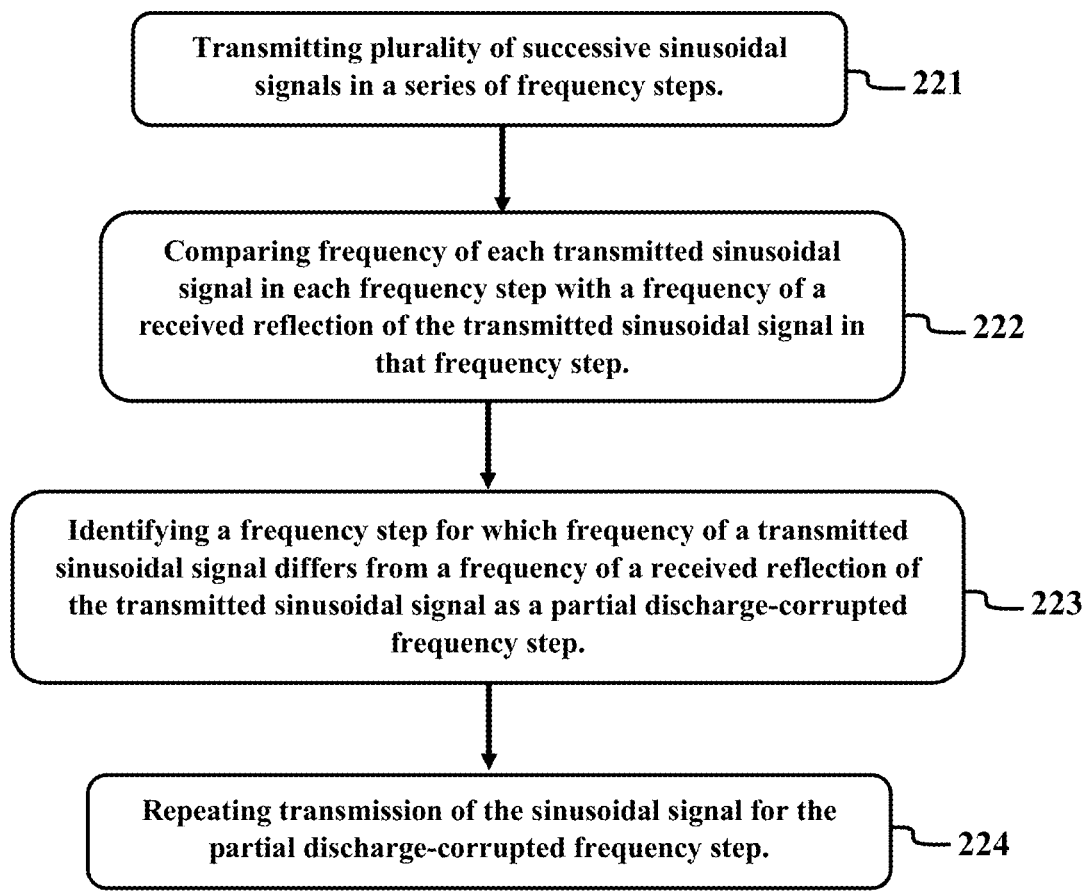
FIG. 2C illustrates a method of detecting signals which contain a partial discharge signal, consistent with one or more exemplary embodiments of the present disclosure.

FIG. 2C illustrates a method 220 of detecting signals which contain a partial discharge signal. The method 220 may include a step 221 of transmitting a plurality of successive sinusoidal signals in a series of frequency steps; a step 222 of comparing frequency of each transmitted sinusoidal signal in each frequency step with a frequency of a received reflection of the transmitted sinusoidal signal in that frequency step; a step 223 of identifying a frequency step for which frequency of a transmitted sinusoidal signal differs from a frequency of a received reflection of the transmitted sinusoidal signal as a partial discharge-corrupted frequency step; and a step 224 of repeating transmission of the sinusoidal signal for the partial discharge-corrupted frequency step.

Referring to FIG. 2C, in the step 222 and the step 223, a generalized likelihood ratio test (GLRT) may be adapted and applied to detect partial discharge occurrence during UHF SAR imaging. In stepped-frequency method, a sinusoidal signal is transmitted and the reflection of a nearby object is recorded. If no partial discharge occurs during this process, the received signal contains a sinusoidal wave with a known frequency but unknown amplitude and phase. The FFT of this signal has a peak at the transmitted signal frequency and other FFT bins contain noise. On the other hand, if a partial discharge occurs, partial discharge signal is added to the received signal components and because of the wide-band nature of the partial discharge signal, it resembles a higher level of background noise. Referring to FIG. 2C, in the step 222 and the step 223, partial discharge occurrence may be detected by omitting the FFT bin that contains the received signal and then comparing sum of square of the amplitude of other FFT bins with a predetermined threshold. If the summation is greater than the threshold, then it is assumed that a partial discharge has occurred, but if the summation is smaller than the threshold, then it is assumed that the received signal only contains the transmitted signal with noise.

In an exemplary embodiment, in a first hypothesis ($H_0$), it may be assumed that there is no partial discharge in the received signal. If it is true, the $k^{th}$ FFT bin contains the transmitted signal in frequency-domain, and other FFT bins contain the background noise. Therefore, if for purposes of the present disclosure, $r_n$ and $ae^{j\Theta}$ are received and transmitted signals, respectively, under $H_0$, the probability density functions of the FFT bins are presented in Equations (2) and (3) as follows:

$$f(r_k \mid H_0) = \frac{1}{\sigma_0 \sqrt{2\pi}} \exp\left(-\frac{|r_k - ae^{j\theta}|^2}{2\sigma_0^2}\right) \quad \text{Equation (2)}$$

$$f(r_n \mid H_0) = \frac{1}{\sigma_0 \sqrt{2\pi}} \exp\left(-\frac{|r_n|^2}{2\sigma_0^2}\right), n = 1, 2, \ldots, N, n \neq k \quad \text{Equation (3)}$$

In equations (2) and (3), $\sigma_0$ and $\sigma_0^2$ denote mean and variance of the background noise, respectively. Under an alternative hypothesis ($H_1$), it is assumed that all FFT bins are corrupted by partial discharge signal and therefore the probability density functions of the FFT bins are presented in Equations (4) and (5), as follows:

$$f(r_k \mid H_1) = \frac{1}{\sqrt{2\pi(\sigma_0^2 + \sigma_1^2)}} \exp\left(-\frac{|r_k - ae^{j\theta}|^2}{2(\sigma_0^2 + \sigma_1^2)}\right) \quad \text{Equation (4)}$$

$$f(r_n | H_1) = \frac{1}{\sqrt{2\pi(\sigma_0^2 + \sigma_1^2)}} \exp\left(-\frac{|r_n|^2}{2(\sigma_0^2 + \sigma_1^2)}\right) \quad \text{Equation (5)}$$

$$n = 1, 2, \ldots, N, n \neq k$$

In equations (3) and (4), $\sigma_1$ and $\sigma_1^2$ denote mean and variance of the partial discharge signal, respectively. According to Neyman-Person lemma, the likelihood function of the test should be compared with a threshold to decide between two hypotheses. The likelihood function of the received signals, $L(r_1, \ldots, r_N)$ may be generated by dividing the probability density functions under alternative and first hypotheses, as presented by Equation (6) below:

$$L(r_1, \ldots, r_N) = \quad \text{Equation (6)}$$
$$\prod_{n=1}^{N} \frac{f(r_n | H_1)}{f(r_n | H_0)} = \frac{f(r_k | H_1)}{f(r_k | H_0)} \times \prod_{n=1, n \neq k}^{N} \frac{f(r_n | H_1)}{f(r_n | H_0)}$$

$$\rightarrow L(r_1, \ldots, r_N) = \quad \text{Equation (7)}$$
$$\left(\frac{\sigma_0^2}{\sigma_0^2 + \sigma_1^2}\right)^{\frac{N}{2}} \times \left(\frac{|r_k - ae^{j\theta}|^2}{2\sigma_0^2} - \frac{|r_k - ae^{j\theta}|^2}{2(\sigma_0^2 + \sigma_1^2)}\right) \times$$
$$\prod_{n=1, n \neq k}^{N} \exp\left(\frac{|r_n|^2}{2\sigma_0^2} - \frac{|r_n|^2}{2(\sigma_0^2 + \sigma_1^2)}\right)$$

$$\rightarrow L(r_1, \ldots, r_N) = \left(\frac{\sigma_0^2}{\sigma_0^2 + \sigma_1^2}\right)^{\frac{N}{2}} \times \quad \text{Equation (8)}$$
$$\exp\left(\frac{\sigma_1^2}{2\sigma_0^2(\sigma_0^2 + \sigma_1^2)}\left(|r_k - ae^{j\theta}|^2 + \sum_{n=1, n \neq k}^{N} |r_n|^2\right)\right)$$

Therefore, the decision is made as follows:

$$L(r_1, \ldots, r_N) \overset{H_0}{\underset{H_1}{\lessgtr}} \eta \quad \text{Equation (9)}$$

In Equation (9), $\eta$ denotes the decision threshold, the value of which may be determined in accordance with the acceptable probability of false alarm ($P_{fa}$). Regarding the monotonically increasing phenomenon of the exponential function, the decision strategy may be rewritten as Equation (10) below:

$$\left(|r_k - ae^{j\theta}|^2 + \sum_{n=1, n \neq k}^{N} |r_n|^2\right) \overset{H_0}{\underset{H_1}{\lessgtr}} \quad \text{Equation (10)}$$
$$\frac{2\sigma_0^2(\sigma_0^2 + \sigma_1^2)}{\sigma_1^2} \times \ln\left(\eta\left(\frac{\sigma_0^2 + \sigma_1^2}{\sigma_1^2}\right)^{\frac{N}{2}}\right) = \eta_1$$

The problem with this decision is that $a$, $\theta$, and $\sigma_1$ are unknown. Referring to above decision strategy in Equation (10), the value of $\sigma_1$ is not important because it only affects the threshold value ($\eta_1$). However, the threshold value may be directly computed considering the acceptable $P_{fa}$. Both $a$ and $\theta$ values directly affect the decision strategy.

In generalized likelihood ratio test (GLRT), the unknown parameters may be estimated using maximum likelihood (ML) method. The ML estimation of $ae^{-j\theta}$ is equal to $r_k$. Therefore, $$E\{ae^{j\theta}\} = r_k \quad \text{Equation (11)}$$

$$\left(|r_k - r_k|^2 + \sum_{n=1, n \neq k}^{N} |r_n|^2\right) \overset{H_0}{\underset{H_1}{\lessgtr}} \eta_1 \quad \text{Equation (12)}$$

$$\sum_{n=1, n \neq k}^{N} |r_n|^2 \overset{H_0}{\underset{H_1}{\lessgtr}} \eta_1 \quad \text{Equation (13)}$$

This inequality in Equation (13) shows that, to make a decision about the presence or absence of a partial discharge, first the FFT bin that contains the received signal should be omitted. Then, the sum of the square of the amplitude of other FFT bins should be compared with a predetermined threshold. If the summation is greater than the threshold, then it may be assumed that a PD has occurred, but if the summation is smaller than the threshold, then it may be assumed that the received signal only contains the transmitted signal with noise.

As mentioned earlier, in order to have an acceptable $P_{fa}$, a suitable decision threshold should be set. The false alarm happens, if there is no partial discharge, but the decision may be that a partial discharge has occurred. If around 3000 frequency steps are generated before each image construction and we set the $P_{fa}$ equal to $10^{-7}$, it means that only one out of $3.3 \times 10^3$ images may contain an error which is difficult to detect.

Regarding above-mentioned strategy, $\eta_1$ should be selected properly, so that the probability of $\Sigma_{n=1, n \neq k}^{N} |r_n|^2 > \eta_1$ be equal to $10^{-7}$ under no partial discharge occurrence, where $r_n$ samples are independent complex Gaussian noise with zero mean value and known variance $\sigma_0^2$. Therefore, $\Sigma_{n=1, n \neq k}^{N} |r_n|^2 / \sigma_0^2$ is a Chi-square variable with $2 \times (N-1)$ degrees of freedom. Therefore, the probability of $\Sigma_{n=1, n \neq k}^{N} |r_n|^2$ crossing $\eta_1$ is equal to:

$$P_{fa} = 1 - \frac{1}{(N-2)!} \gamma\left(N-1, \frac{\eta_1}{2\sigma_0^2}\right) \quad \text{Equation (14)}$$

Here $\gamma$ is lower incomplete gamma function and is defined as follows:

$$\gamma(s, x) = \int_0^x t^{s-1} e^{-t} dt \quad \text{Equation (15)}$$

Therefore, $$\int_0^{\frac{\eta_1}{2\sigma_0^2}} t^{N-2} e^{-t} dt = (N-2)!(1 - P_{fa}) \quad \text{Equation (16)}$$

This equation should be numerically calculated to find a suitable value of $\eta_1$ for a predetermined $P_{fa}$.

With further reference to FIG. 2C, once a partial discharge-corrupted frequency step is identified by for example the GLRT as described in detail herein, the transmission of the sinusoidal signal for that partial discharge-corrupted frequency step may be repeated in order to obtain a partial discharge-free frequency step.

EXAMPLE

In this example, an implementation of UHF SAR imaging with a stepped frequency method is described. For purposes of this disclosure, two simplified models of a transformer winding are provided. One intact transformer winding without any kind of deformation is provided which is referred to herein as intact model. A second model is prepared based on the intact model, on which a radial deformation is simulated. The second model is referred to herein as deformed model.

Figure 4A:
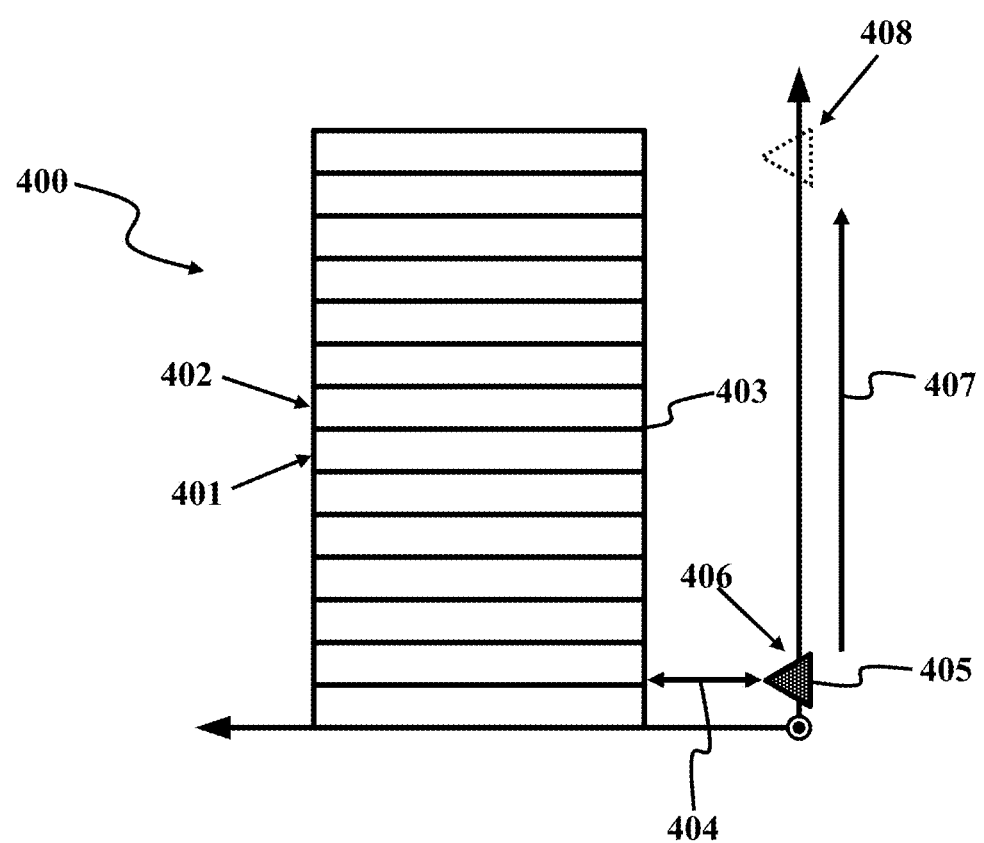
FIG. 4A is a schematic representation of an intact transformer winding model, consistent with one or more exemplary embodiments of the present disclosure.

Referring to FIG. 4A, a schematic representation of the intact model 400 is illustrated. The intact model 400 includes 14 Plexiglas disks, such as Plexiglas disk 401 and Plexiglas disk 402. The Plexiglas disks are covered by copper strips and a thin plastic layer is disposed between the Plexiglas disks in order to separate the Plexiglas disks. For example, plastic layer 403 is placed between Plexiglas disk 401 and Plexiglas disk 402. Diameter of each Plexiglas disk is about 600 mm and height of each Plexiglas disk is about 20 mm with a space of approximately 5 mm between the Plexiglas disks. Total height of the intact model 400 is 370 cm and distance 404 between transceiver antennas 405 and the intact model is approximately 350 mm.

Figure 4B:
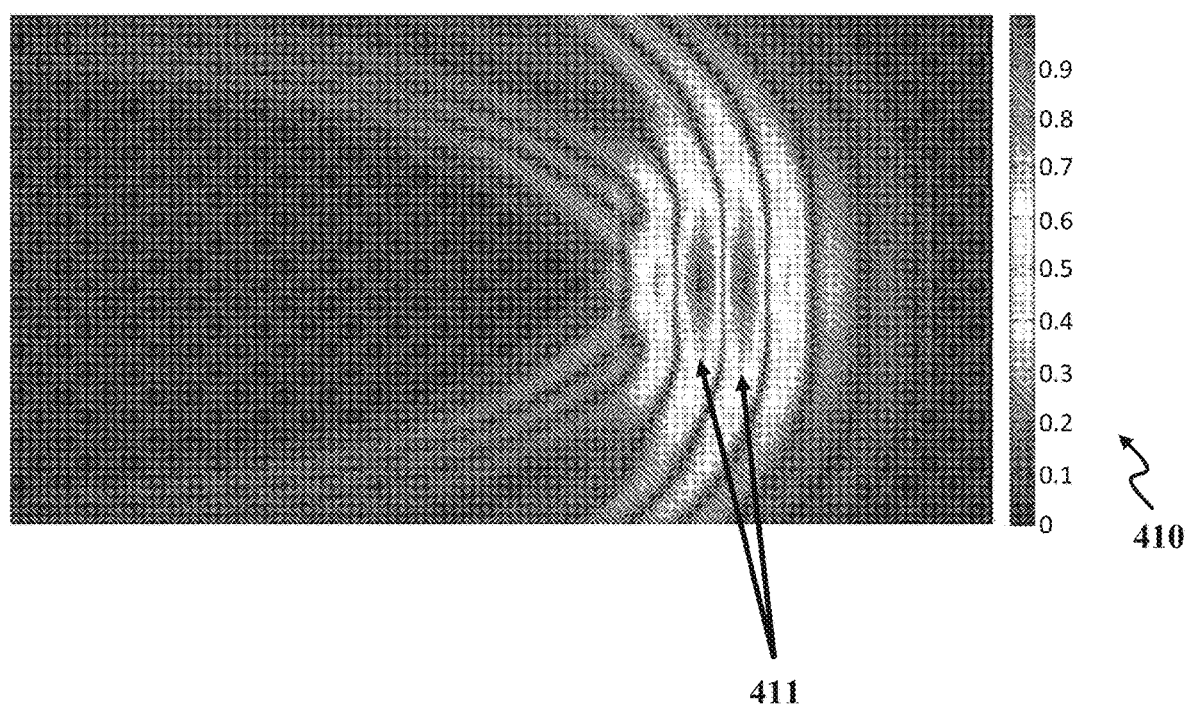
FIG. 4B is a color-coded map of an intact transformer winding model generated using the amounts of energy calculated by the Kirchhoff migration method, consistent with one or more exemplary embodiments of the present disclosure.

UHF SAR imaging of the intact model 400 was carried out by a stepped frequency method as was described in detail in preceding sections of the present disclosure. In a first scanning step 406, UHF electromagnetic signals were transmitted as a plurality of successive sinusoidal signals and received reflections of the plurality of sinusoidal signals from the intact model 400 were gathered. The signals were transmitted and received by two transceiver antennas 405. A time domain reflected UHF electromagnetic signal for the first scanning step 406 was obtained by performing an inverse fast Fourier transform (IFFT) on the magnitudes and phases of the gathered reflected sinusoidal signals. Then, step by step, the two transceiver antennas 405 were moved along a scanning path 407 from one scanning step to the next, where transmitting and receiving the sinusoidal signals were performed for each scanning step along the scanning path 407. In this example, 33 scanning steps were used for UHF SAR imaging of the intact model 400, from the first scanning step 405 to a last scanning step 408. After receiving the reflected UHF electromagnetic signals for all 33 scanning steps, an amount of energy reflected from each point of the surface of the intact model 400 was calculated using the Kirchhoff migration method as was presented in Equation (1). The calculated energies may either be presented as a matrix of values or the calculated energies may be presented as a color-coded image. FIG. 4B is a color-coded map of the intact model 400 generated using the amounts of energy calculated by the Kirchhoff migration method. In these color-coded maps, color of points represent the amount of energy reflected from a corresponding point on the surface of the intact model 400. Scale 410 indicates the amount of energy reflected from the surface of the winding divided by the maximum reflected energy.

Figure 5A:
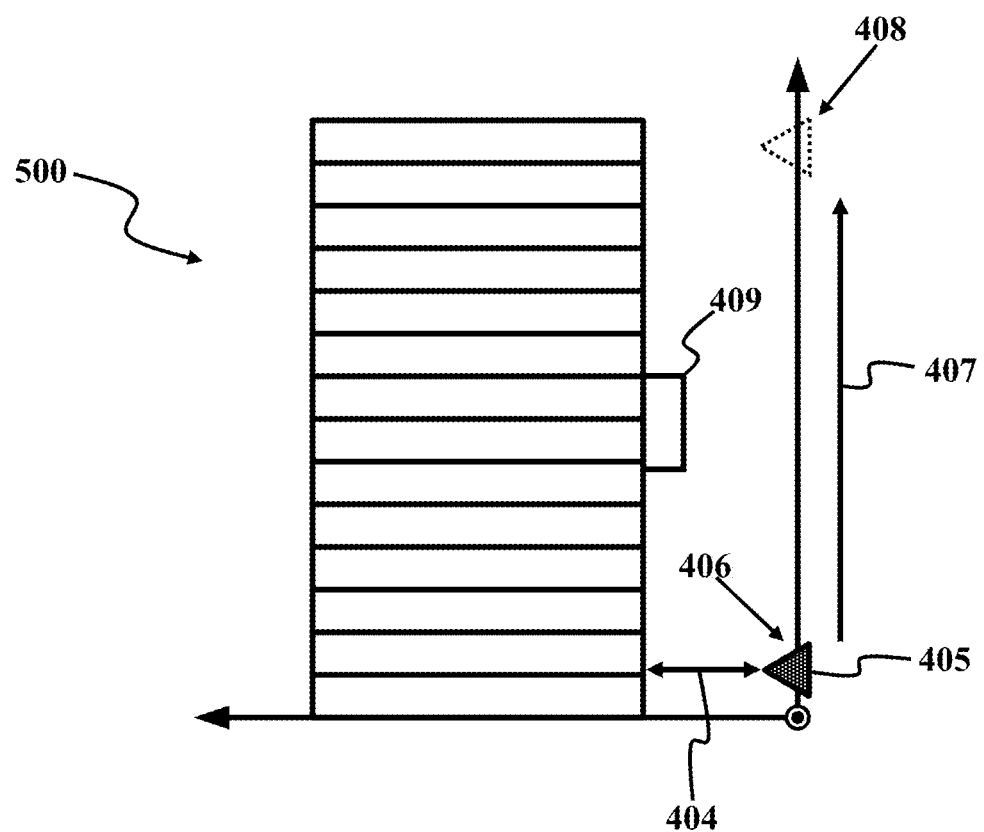
FIG. 5A is a schematic representation of a deformed transformer winding model, consistent with one or more exemplary embodiments of the present disclosure.

Referring to FIG. 5A, a schematic representation of the deformed model 500 is illustrated. The deformed model 500 may be similar to the intact model 400, except a deformation 409 in the form of a box with a height of approximately 6 cm, a length of approximately 4 cm and a depth of 2.5 cm, which is placed on the winding model.

Figure 5B:
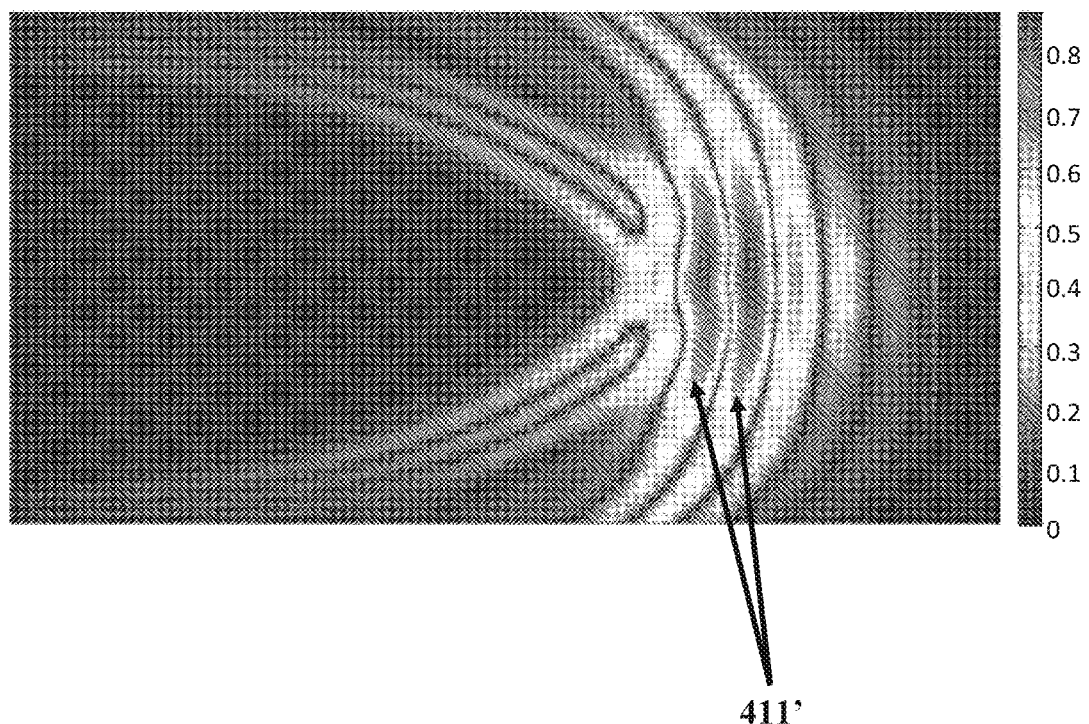
FIG. 5B is a color-coded map of an deformed transformer winding model generated using the amounts of energy calculated by the Kirchhoff migration method, consistent with one or more exemplary embodiments of the present disclosure.

UHF SAR imaging of the deformed model 500 was also carried out by a stepped frequency method as was described in detail in preceding sections of the present disclosure. In a first scanning step 406, UHF electromagnetic signals were transmitted as a plurality of successive sinusoidal signals and received reflections of the plurality of sinusoidal signals from the deformed model 500 were gathered. The signals were transmitted and received by two transceiver antennas 405. A time domain reflected UHF electromagnetic signal for the first scanning step 406 was obtained by performing an inverse fast Fourier transform (IFFT) on the gathered reflected sinusoidal signals. Then, step by step, the two transceiver antennas 405 were moved along a scanning path 407 from one scanning step to the next, where transmitting and receiving the sinusoidal signals were performed for each scanning step along the scanning path 407. In this example, 33 scanning steps were used for UHF SAR imaging of the deformed model 500, from the first scanning step 405 to a last scanning step 408. After receiving the reflected UHF electromagnetic signals for all 33 scanning steps, an amount of energy reflected from each point of the surface of the deformed model 500 was calculated using the Kirchhoff migration method as was presented in Equation (1). The calculated energies may either be presented as a matrix of values or the calculated energies may be presented as a color-coded image. FIG. 5B is a color-coded map of the deformed model 500 generated using the amounts of energy calculated by the Kirchhoff migration method. In these color-coded maps, color of points represent the amount of energy reflected from a corresponding point on the surface of the deformed model 500.

Figure 5C:
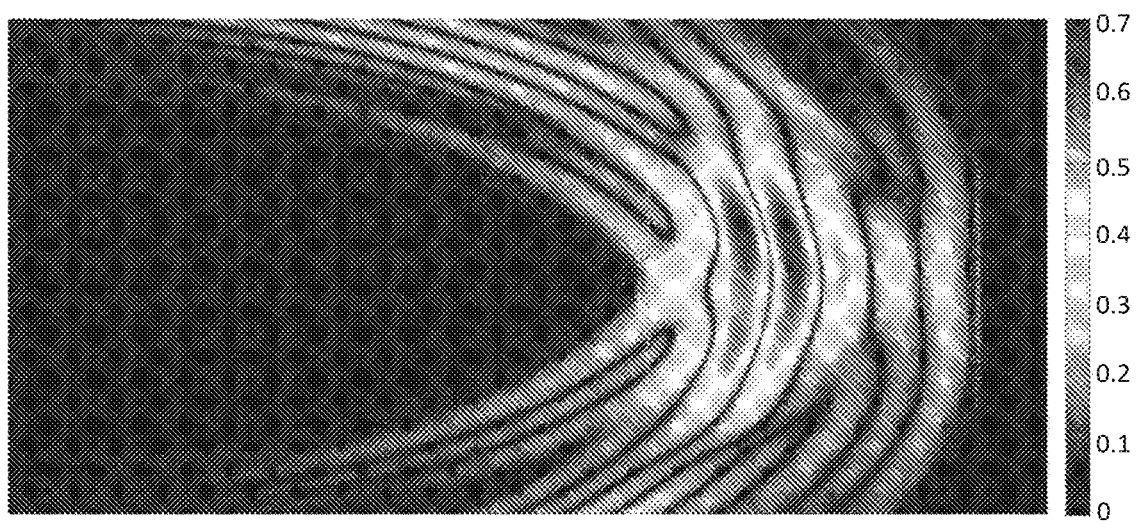
FIG. 5C shows a partial-discharge corrupted color-coded map of an intact transformer winding model, consistent with one or more exemplary embodiments of the present disclosure.

Referring to FIG. 4B, spots 411 indicate a large amount of energy reflection, which is a sign of the presence of the winding surface in the environment, in which the electromagnetic waves are transmitted. Referring to FIG. 5B, spots 411' appear larger when compared to the spots 411 of the intact model, which means, a larger amount of energy is reflected from some points of the winding surface, which in turn may be an indicator of the deformation on the surface of the winding. As mentioned herein, FIGS. 4B and 5B are obtained utilizing the stepped frequency UHF SAR imaging method pursuant to an embodiment of the resent disclosure in order to eliminate the distortions that may be caused by partial discharge occurrence. For purposes of clarity, FIG. 5C shows a partial-discharge corrupted color-coded map of the intact model 400 generated without utilizing the stepped-frequency method. As can be seen in FIG. 5C, the image is distorted and it may lead to a wrong decision that the winding is deformed.

Figure 6:
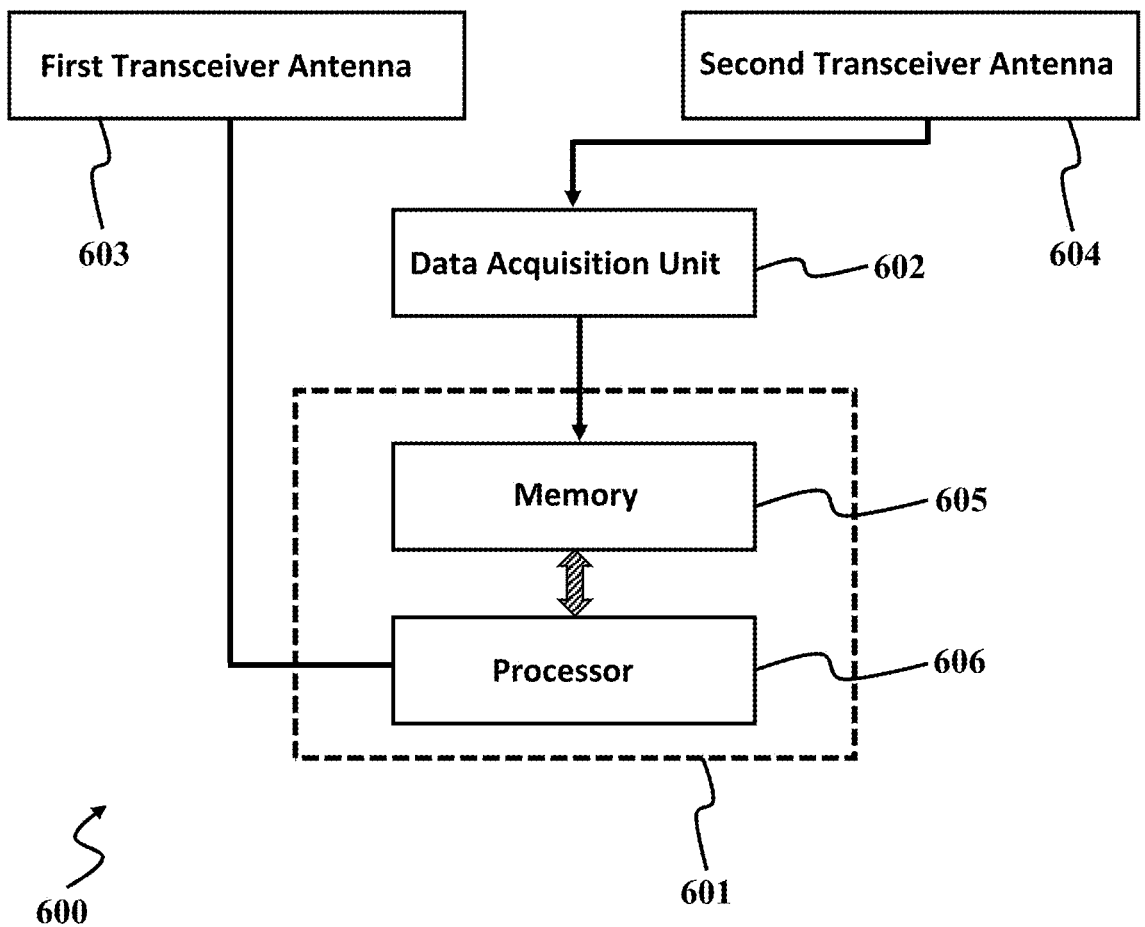
FIG. 6 is a schematic functional block diagram of one embodiment of a system for detecting radial deformation in a transformer winding, consistent with one or more exemplary embodiments of the present disclosure.

FIG. 6 is a schematic functional block diagram of a system 600 for detecting radial deformation in a transformer winding, consistent with one more exemplary embodiments of the present disclosure. As provided herein, the system 600 may include a data processing unit 601, a data acquisition unit 602, a first transceiver antenna 603 that may be similar to the first transceiver antenna 102 of FIG. 1A, and a second transceiver antenna 604 that may be similar to the first transceiver antenna 103 of FIG. 1A.

Referring to FIG. 6, in one exemplary embodiment, the data processing unit 601 may include a memory 605 and a processor 606. Processor 606 may be a general-purpose computer processor or a specialized processor designed specifically for use with the data processing unit 601. Processor 606 is coupled with the memory 605 to permit storage of data and software that are to be manipulated by commands to the processor 606.

The data processing unit 601 may be operatively connected to the first transceiver antenna and the memory may include executable instructions encoded thereon, such that upon execution by the processor 606, the data processing unit 601 may urge the first transceiver antenna 603 to transmit UHF electromagnetic signals using the stepped-frequency method of this disclosure in a series of scanning steps as was described in detail in preceding sections of the present disclosure. The second transceiver antenna 604 may receive the reflection of the transmitted signals by the first transceiver antenna 603 for each scanning step. The data acquisition unit 602 gathers the received signals for all scanning steps. Magnitudes and phases of the gathered signals may be stored on the memory 605. The memory 605 may further include executable instructions, such that upon execution by the processor 606, the processor 606 performs IFFT on the magnitude and phases of the gathered signals in order to obtain a time domain reflected UHF electromagnetic signal for each scanning step. The processor 606 may further be configured to calculate an amount of energy reflected from the surface of the transformer based on the obtained time domain reflected UHF electromagnetic signals of all scanning steps.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for detecting radial deformation in a winding of a transformer, the method comprising:
    synthetic aperture radar (SAR) imaging of the winding using ultra high frequency (UHF) electromagnetic signals in a first instance of the winding to obtain a first image of the winding, the first instance of the winding corresponding to a deformation-free winding;
    SAR imaging of the winding using UHF electromagnetic signals in a second instance of the winding to obtain a second image of the winding; and
    detecting a radial deformation in the winding by comparing the first image of the winding and the second image of the winding,
    wherein the UHF electromagnetic signals are transmitted as a plurality of successive sinusoidal signals, the plurality of successive sinusoidal signals transmitted in a series of successive frequency steps, wherein in each frequency step of the series of successive frequency steps, a respective sinusoidal signal is transmitted, the frequency of each respective transmitted sinusoidal signal changes from one frequency step to a next frequency step with a predetermined frequency step,
    wherein the SAR imaging comprises:
        transmitting UHF electromagnetic signals by a first transceiver antenna;

receiving reflected UHF electromagnetic signals from a surface of the winding by a second transceiver antenna, wherein transmitting UHF electromagnetic signals and receiving reflected UHF electromagnetic signals are carried out in a series of scanning steps, the first transceiver antenna and the second transceiver antenna are gradually moved along a longitudinal axis of the winding from one scanning step to the next, and calculating an amount of energy reflected from each point of the surface of the winding based on the received reflected UHF electromagnetic signals of all scanning steps, and wherein, receiving the reflected UHF electromagnetic signals in each scanning step comprises receiving reflections of the plurality of successive sinusoidal signals for all frequency steps in each scanning step and performing an inverse fast Fourier transform (IFFT) on magnitudes and phases of the reflections of the plurality of successive sinusoidal signals.

2. The method of claim 1, wherein comparing the first image and the second image comprises:

comparing the amount of energy reflected from each point of the surface of the winding in the first instance with the amount of energy reflected from each point of the winding in the second instance.

3. The method of claim 1, wherein calculating the amount of energy reflected from each point of the surface of the winding is carried out utilizing Kirchhoff migration method.

4. The method of claim 1, further comprising:

comparing frequency of each transmitted sinusoidal signal in each frequency step with a frequency of a received reflection of the transmitted sinusoidal signal in that frequency step.

5. The method of claim 4, further comprising:

identifying a frequency step for which frequency of a transmitted sinusoidal signal differs from a frequency of a received reflection of the transmitted sinusoidal signal as a partial discharge-corrupted frequency step.

6. The method of claim 5, wherein identifying a partial discharge-corrupted frequency step is carried out by a generalized likelihood ratio test.

7. The method of claim 6, further comprising:

repeating transmission of the sinusoidal signal for the partial discharge-corrupted frequency step.

* * * * *